(12) United States Patent
Li et al.

(10) Patent No.: US 10,825,930 B2
(45) Date of Patent: Nov. 3, 2020

(54) THIN FILM TRANSISTOR AND MANUFACTURE METHOD THEREOF

(71) Applicant: BOE TECHNOLOGY GROUP CO., LTD., Beijing (CN)

(72) Inventors: Dong Li, Beijing (CN); Yucheng Chan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/990,763

(22) Filed: May 28, 2018

(65) Prior Publication Data

US 2019/0157454 A1    May 23, 2019

(30) Foreign Application Priority Data

Nov. 20, 2017    (CN) .......................... 2017 1 1160298

(51) Int. Cl.
| H01L 21/02 | (2006.01) |
| H01L 29/78 | (2006.01) |
| H01L 29/49 | (2006.01) |
| H01L 29/786 | (2006.01) |
| H01L 21/28 | (2006.01) |
| H01L 29/66 | (2006.01) |

(52) U.S. Cl.
CPC ........ *H01L 29/7843* (2013.01); *H01L 21/022* (2013.01); *H01L 21/0217* (2013.01); *H01L 21/02164* (2013.01); *H01L 21/02181* (2013.01); *H01L 21/02211* (2013.01); *H01L 21/02266* (2013.01); *H01L 21/02274* (2013.01); *H01L 21/28158* (2013.01); *H01L 29/4908* (2013.01); *H01L 29/66757* (2013.01); *H01L 29/78675* (2013.01)

(58) Field of Classification Search
CPC .............. H01L 21/022; H01L 29/7843; H01L 21/02211; H01L 21/02181; H01L 21/28158; H01L 21/0217; H01L 21/02274; H01L 29/4908; H01L 21/02164; H01L 21/02266; H01L 29/66757

See application file for complete search history.

(56) References Cited

U.S. PATENT DOCUMENTS

| 7,510,905 B2* | 3/2009 | Fujii | ................. H01L 29/42384 438/99 |
| 8,269,908 B2* | 9/2012 | Oda | ................. H01L 29/66765 349/43 |

(Continued)

FOREIGN PATENT DOCUMENTS

| CN | 101023530 A | 8/2007 |
| JP | 6468967 A | 3/1989 |

OTHER PUBLICATIONS

First Chinese Office Action dated Oct. 9, 2019, received for corresponding Chinese Application No. 201711160298.2, 14 pages.

(Continued)

*Primary Examiner* — Savitri Mulpuri
(74) *Attorney, Agent, or Firm* — Kinney & Lange, P.A.

(57) ABSTRACT

Disclosed are a thin film transistor and a manufacture method thereof. The thin film transistor according to the embodiments of the present disclosure comprises: a base substrate; an active layer composed of polysilicon on the base substrate; and a first gate insulating layer having a preset intrinsic tensile stress on the active layer.

10 Claims, 2 Drawing Sheets

(56) References Cited

U.S. PATENT DOCUMENTS

| | | | |
|---|---|---|---|
| 9,490,275 B2 * | 11/2016 | Moon | H01L 29/4908 |
| 2006/0060856 A1 | 3/2006 | Anderson et al. | |
| 2007/0222035 A1 * | 9/2007 | Huang | H01L 29/78 257/618 |
| 2009/0001453 A1 * | 1/2009 | Richter | H01L 21/82380 257/327 |
| 2016/0218114 A1 | 7/2016 | Moon et al. | |

OTHER PUBLICATIONS

International Search Report dated Sep. 26, 2019, received for corresponding Chinese Application No. 201711160298.2, 2 pages.

\* cited by examiner

THIN FILM TRANSISTOR AND MANUFACTURE METHOD THEREOF

CROSS REFERENCE TO RELATED APPLICATION

The present application claims a priority benefit of Chinese Patent Application No. 201711160298.2, filed on Nov. 20, 2017, the entire contents thereof being incorporated herein by reference.

TECHNICAL FIELD

The present disclosure relates to the technical field of semiconductor display, and particularly to a thin film transistor and a manufacture method thereof.

BACKGROUND

In various display devices, such as a liquid crystal television, smartphone, tablet computer, digital camera, automatic teller machine and the like, thin film transistors (TFTs) are generally used as switch elements to control pixels or used as driving elements to drive pixels.

Thin film transistors can be classified into two types, amorphous silicon (a-Si) thin film transistors and polysilicon (Poly-Si) thin film transistors, according to the silicon thin film property of the active layer. Polysilicon thin film transistors have a higher carrier mobility than that of amorphous silicon thin film transistors. Thus, display devices made by using polysilicon thin film transistors may have a higher resolution (PPI) and a higher screen refresh rate, and therefore polysilicon technologies gradually have become a main trend in the research and development of thin film transistors in place of amorphous silicon technologies.

SUMMARY

The embodiments of the present disclosure provide a thin film transistor comprising:
a base substrate;
an active layer composed of polysilicon on the base substrate; and
a first gate insulating layer having a preset intrinsic tensile stress on the active layer.

In one possible implementation, in the above-mentioned thin film transistor provided in the embodiments of the present disclosure, the preset intrinsic tensile stress is in a range of 500 MPa to 800 MPa.

In one possible implementation, in the above-mentioned thin film transistor provided in the embodiments of the present disclosure, the first gate insulating layer has a thickness of 600 Å to 1200 Å.

In one possible implementation, in the above-mentioned thin film transistor provided in the embodiments of the present disclosure, a material of the first gate insulating layer is one of hafnium dioxide, silicon dioxide, and silicon nitride, or a combination thereof.

In one possible implementation, the above-mentioned thin film transistor provided in the embodiments of the present disclosure further comprises:
a second gate insulating layer having a preset intrinsic pressure stress on the first gate insulating layer.

In one possible implementation, in the above-mentioned thin film transistor provided in the embodiments of the present disclosure, the preset intrinsic pressure stress is in a range of −100 MPa to −400 MPa.

In one possible implementation, in the above-mentioned thin film transistor provided in the embodiments of the present disclosure, the second gate insulating layer has a thickness of 300 Å to 600 Å.

In one possible implementation, in the above-mentioned thin film transistor provided in the embodiments of the present disclosure, a material of the second gate insulating layer is one of hafnium dioxide, silicon dioxide, and silicon nitride, or a combination thereof.

In one possible implementation, the above-mentioned thin film transistor provided in the embodiments of the present disclosure further comprises:
a buffer layer between the base substrate and the active layer.

In one possible implementation, the above-mentioned thin film transistor provided in the embodiments of the present disclosure further comprises:
a gate metal layer, an interlayer dielectric layer and a source/drain metal layer sequentially formed on the second gate insulating layer, wherein via holes penetrating to the active layer are provided in the interlayer dielectric layer, the second gate insulating layer and the first gate insulating layer, so as to achieve a connection between the active layer and source/drain electrodes in the source/drain metal layer through the via holes.

In one possible implementation, the above-mentioned thin film transistor provided in the embodiments of the present disclosure is a P-type thin film transistor.

In one possible implementation, the above-mentioned thin film transistor provided in the embodiments of the present disclosure is an N-type thin film transistor.

The embodiments of the present disclosure further provide a manufacture method for the above-mentioned thin film transistor, comprising: providing a base substrate; forming an active layer composed of polysilicon on the base substrate; and forming a first gate insulating layer having a preset intrinsic tensile stress on the active layer.

In one possible implementation, in the above-mentioned manufacture method provided in the embodiments of the present disclosure, said forming the first gate insulating layer having the preset intrinsic tensile stress on the active layer comprises:
forming the first gate insulating layer having an intrinsic tensile stress of 500 MPa to 800 MPa on the active layer by a plasma enhanced chemical vapor deposition process under conditions of a temperature of 390° C. to 450° C., a power of 1200 W to 1800 W, and a flow rate ratio of silane to nitrous oxide of 0.5 to 2.

In one possible implementation, in the above-mentioned manufacture method provided in the embodiments of the present disclosure, said forming the first gate insulating layer having the preset intrinsic tensile stress on the active layer comprises:
forming the first gate insulating layer having an intrinsic tensile stress of 500 MPa to 800 MPa on the active layer by a physical vapor deposition process under conditions of a temperature of 200° C. to 400° C. and a vacuum degree of $5 \times 10^{-4}$ Pa to $5 \times 10^{-3}$ Pa.

In one possible implementation, in the above-mentioned manufacture method provided in the embodiments of the present disclosure, after forming the first gate insulating layer having the preset intrinsic tensile stress on the active layer, the manufacture method further comprises: forming a second gate insulating layer having a preset intrinsic pressure stress on the first gate insulating layer.

In one possible implementation, in the above-mentioned manufacture method provided in the embodiments of the present disclosure, said forming the second gate insulating layer having the preset intrinsic pressure stress on the first gate insulating layer comprises:

forming the second gate insulating layer having an intrinsic pressure stress of −100 MPa to −400 MPa on the first gate insulating layer by a plasma enhanced chemical vapor deposition process under conditions of a temperature of 250° C. to 350° C., a power of 1200 W to 1800 W, and a flow rate ratio of silane to ammonia gas of 0.1 to 3.

In one possible implementation, in the above-mentioned manufacture method provided in the embodiments of the present disclosure, said forming the active layer composed of polysilicon on the base substrate comprises:

forming a polysilicon thin film on the base substrate by a solid phase crystallization process, a metal-induced lateral crystallization process or an excimer laser annealing process, and then patterning the polysilicon thin film to obtain a pattern of the active layer.

In one possible implementation, the above-mentioned manufacture method provided in the embodiments of the present disclosure further comprises:

depositing a buffer layer on the base substrate, before forming the active layer composed of polysilicon on the base substrate.

In one possible implementation, the above-mentioned manufacture method provided in the embodiments of the present disclosure further comprises:

forming a gate metal layer, an interlayer dielectric layer and a source/drain metal layer sequentially on the second gate insulating layer, wherein via holes penetrating to the active layer are provided in the interlayer dielectric layer, the second gate insulating layer and the first gate insulating layer, so as to achieve a connection between the active layer and source/drain electrodes in the source/drain metal layer through the via holes.

DETAILED DESCRIPTION

Figure 1A:
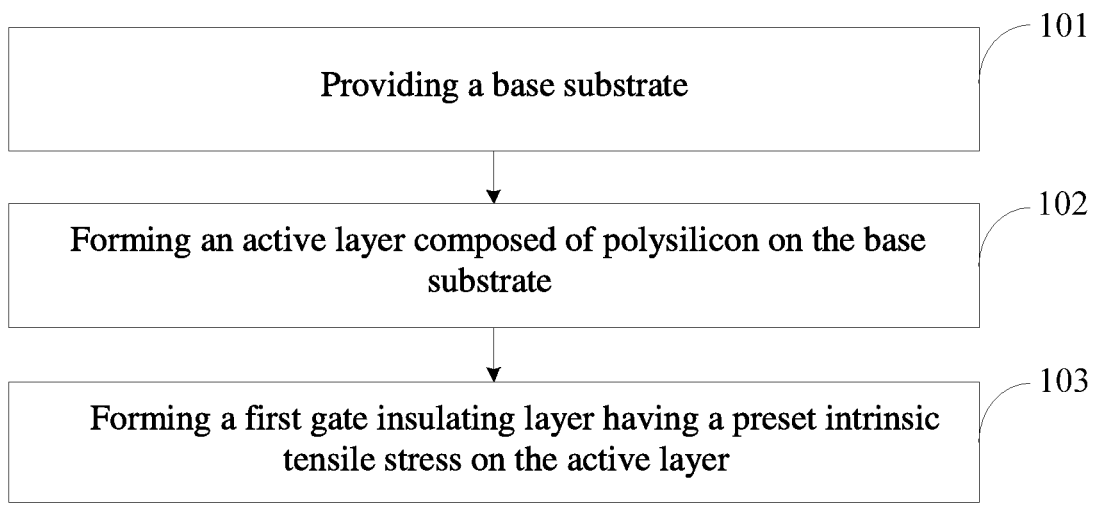
FIGS. 1a and 1b are flow charts of manufacture methods of thin film transistors provided in embodiments of the present disclosure respectively.

Currently, the crystallization quality of an active layer composed of polysilicon is generally improved by adjusting an excimer laser annealing (ELA) process, so as to increase the carrier mobility of a thin film transistor. However, the present disclosure provides a manufacture method for a thin film transistor and a thin film transistor manufactured therefrom, which can increase the carrier mobility of a thin film transistor without adding additional process or structure.

Particular embodiments of the manufacture method of a thin film transistor and the thin film transistor provided in the embodiments of the present disclosure will be described in detail below with reference to the drawings. It should be noted that the embodiments described in the specification are only a part of, but not all of the embodiments of the present disclosure. Unless contradicted, the embodiments of the present application and the features in the embodiments can be combined with each other. Further, all of other embodiments obtained by those skilled in the art based on the embodiments of the present disclosure, without inventive efforts, fall within the protection scope of the present application.

The shape and size of each film layer in the drawings do not indicate the actual proportion of the film layer in the thin film transistor, and are only for the purpose of schematically illustrating the present disclosure.

The embodiments of the present disclosure provide a thin film transistor comprising:

a base substrate;

an active layer composed of polysilicon on the base substrate; and a first gate insulating layer having a preset intrinsic tensile stress on the active layer.

As shown in FIG. 1a, the manufacture method of a thin film transistor provided in the embodiments of the present disclosure may particularly comprise the following steps:

S101: providing a base substrate;

S102: forming an active layer composed of polysilicon on the base substrate; and S103: forming a first gate insulating layer having a preset intrinsic tensile stress on the active layer.

In the above-mentioned thin film transistor and manufacture method provided in the embodiments of the present disclosure, since the lattice size of the polysilicon in the active layer may change under the action of the preset intrinsic tensile stress of the first gate insulating layer, the carrier mobility of the thin film transistor can be effectively increased. Thus, the technical solutions of the present disclosure further increase the carrier mobility of the thin film transistor by setting the intrinsic tensile stress of the first gate insulating layer, without adding additional process or structure.

It should be noted that due to the preset intrinsic tensile stress, the first gate insulating layer may shrink relative to the active layer, such that the polysilicon in the active layer is subjected to corresponding stress to cause the lattice size to be changed. The preset intrinsic tensile stress may be 500 MPa to 800 MPa, so as to apply an appropriate stress to the polysilicon, without causing crack of the active layer due to excessively large stress. The magnitude of the intrinsic tensile stress may be measured by a method of measuring thin film stress with a cantilever.

In the above-mentioned thin film transistor and manufacture method provided in the embodiments of the present disclosure, the base substrate may be a rigid base substrate such as glass base substrate, or a flexible base substrate such as a plastic substrate with good heat resistance and durability composed of polyvinyl ether phthalate, polyethylene naphthalenedicaboxylate, polycarbonate, polyaryl compound, polyether imide, polyether sulfone, polyimide or the like, and this is not limited here.

Further, in the above-mentioned manufacture method provided in the embodiments of the present disclosure, a polysilicon thin film may be formed by a process such as solid phase crystallization (SPC), metal-induced lateral crystallization (MILC), excimer laser annealing (ELA) or the like, and then the polysilicon thin film is patterned to obtain a pattern of the active layer.

Particularly, as an example, the polysilicon is prepared by an excimer laser annealing process to facilitate the subsequent formation of the active layer. Step S102 of forming an active layer composed of polysilicon on the base substrate may be particularly performed by the following steps: depositing a buffer layer and an amorphous silicon thin film layer sequentially on a base substrate; subjecting the amorphous silicon thin film layer to a thermal annealing and an excimer laser annealing to obtain a polysilicon thin film layer; and applying a photoresist on the resulting polysilicon thin film layer, exposing, developing, then performing an etching treatment and removing the photoresist to form the active layer. During subjecting the amorphous silicon thin film layer to the excimer laser annealing, the crystallization quality may be improved by adjusting parameters of the excimer laser annealing process, so as to obtain a higher carrier mobility. Further, because the active layer utilizes the polysilicon material, optionally, a light shielding layer may be formed between the base substrate and the buffer layer to shield an external light from the polysilicon material and prevent the active layer from generating a photo-induced carrier, thereby avoiding the influence on the switch characteristic of the thin film transistor.

In particular implementation, in the above-mentioned manufacture method provided in the embodiments of the present disclosure, Step S103 of forming a first gate insulating layer having a preset intrinsic tensile stress on the active layer may be particularly achieved by, but not limited to, the following two possible implementation manners.

Particularly, one possible implementation manner is to form a first gate insulating layer having an intrinsic tensile stress of 500 MPa to 800 MPa on the active layer by a plasma enhanced chemical vapor deposition process, under conditions of a temperature of 390° C. to 450° C., a power of 1200 W to 1800 W, and a flow rate ratio of silane to nitrous oxide ($SiH_4/N_2O$) of 0.5 to 2.

The other possible implementation manner is to form a first gate insulating layer having an intrinsic tensile stress of 500 MPa to 800 MPa on the active layer by a physical vapor deposition process at a temperature of 200° C. to 400° C. and a vacuum degree of $5\times10^{-4}$ Pa to $5\times10^{-3}$ Pa.

For example, a first gate insulating layer having a preset intrinsic tensile stress of 500 MPa to 800 MPa and a thickness of 600 Å to 1200 Å and a material of which is hafnium dioxide ($HfO_2$) is deposited on the active layer by a physical vapor deposition process at a temperature of 200° C. to 400° C. and a vacuum degree of $5\times10^{-4}$ Pa to $5\times10^{-3}$ Pa.

The physical vapor deposition process may include electron beam evaporation by bombarding a target with an electron beam, and the like.

In particular implementation, in the above-mentioned thin film transistor and the manufacture method provided in the embodiments of the present disclosure, the first gate insulating layer may have a thickness of 600 Å to 1200 Å. And the material of the first gate insulating layer may be one of hafnium dioxide, silicon dioxide and silicon nitride or a combination thereof. Of course, in practical manufacture, the material of the first gate insulating layer may also be other materials for a gate insulating layer known in the art, and this is not limited here.

Figure 1B:
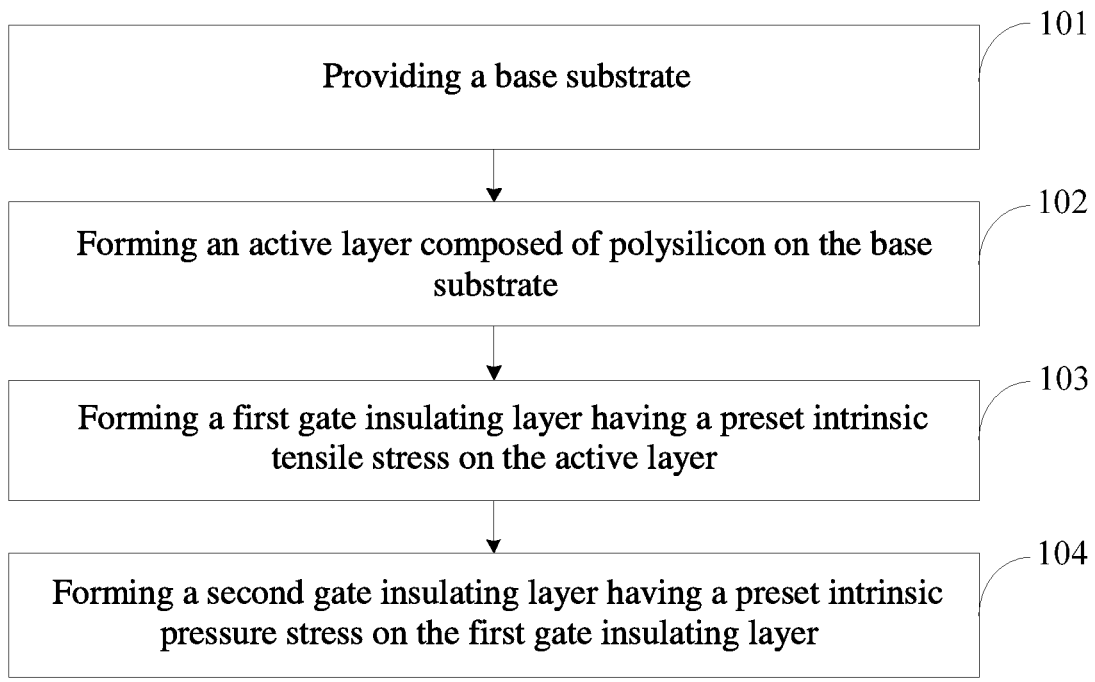

In particular implementation, in order to alleviate the influence of the first gate insulating layer having a higher intrinsic tensile stress on subsequent film layers, in the above-mentioned manufacture method provided in the embodiments of the present disclosure, optionally, the following step may be further performed after Step S103 of forming a first gate insulating layer having a preset intrinsic tensile stress on the active layer, as shown in FIG. 1b:

S104: forming a second gate insulating layer having a preset intrinsic pressure stress on the first gate insulating layer.

The preset intrinsic pressure stress may be measured by a method of measuring thin film stress with a cantilever, and it may be in a range of −100 MPa to −400 MPa.

Thus, an overall stress of a gate insulating layer composed of the first gate insulating layer having a higher intrinsic tensile stress and the second gate insulating layer having a certain intrinsic pressure stress together may be made relatively small, so as to alleviate the influence of the first gate insulating layer having a higher intrinsic tensile stress on subsequent film layers. Here, the subsequent film layers generally comprise a gate metal layer, an interlayer dielectric layer and a source/drain metal layer sequentially formed on the second gate insulating layer. And via holes penetrating to the active layer are provided in the interlayer dielectric layer, the second gate insulating layer and the first gate insulating layer, so as to achieve a connection between the active layer and source/drain electrodes in the source/drain metal layer through the via holes.

It should be noted that in order to simplify the manufacture process, to save the manufacture cost, and to increase the production efficiency, in the above-mentioned thin film transistor and the manufacture method provided in the embodiments of the present disclosure, patterns of a gate electrode and a gate line may be prepared simultaneously by one patterning process. Of course, two patterning processes may be used, in which one patterning process is used for preparing the pattern of the gate electrode, and the other patterning process is used for preparing the pattern of the gate line, and this is not limited here. The material of the gate electrode and the gate line may be one of molybdenum, aluminum, tungsten, titanium, copper, or an alloy thereof, and this is not limited here.

In addition, in order to simplify the manufacture process, to save the manufacture cost, and to increase the production efficiency, in the above-mentioned thin film transistor and the manufacture method provided in the embodiments of the present disclosure, patterns of source/drain electrodes and a data line may also be prepared simultaneously by one patterning process. Of course, two patterning processes may be used to respectively prepare the patterns of the source/drain electrodes and the data line, and this is not limited here. The material of the source/drain electrodes and the data line may be one of molybdenum, aluminum, tungsten, titanium, copper, or an alloy thereof, and this is not limited here.

In particular implementation, in the above-mentioned manufacture method provided in the embodiments of the present disclosure, Step S104 of forming a second gate insulating layer having a preset intrinsic pressure stress on the first gate insulating layer may be particularly achieved by, but not limited to, the following implementation manner:

forming a second gate insulating layer having an intrinsic pressure stress of −100 MPa to −400 MPa on the first gate insulating layer by a plasma enhanced chemical vapor deposition process under conditions of a temperature of 250° C. to 350° C., a power of 1200 W to 1800 W, and a flow rate ratio of silane to ammonia gas ($SiH_4/NH_3$) of 0.1 to 3.

In particular implementation, in the above-mentioned thin film transistor and the manufacture method provided in the embodiments of the present disclosure, the second gate insulating layer may have a thickness of 300 Å to 600 Å. The material of the second gate insulating layer may be one of hafnium dioxide, silicon dioxide and silicon nitride or a combination thereof. Of course, in practical manufacture, the material of the second gate insulating layer may also be other materials for a gate insulating layer known in the art, and this is not limited here.

It should be noted that in the above-mentioned manufacture method provided in the embodiments of the present disclosure, patterning processes involved in forming various film layer structures may not only comprise a part or all of process procedures of deposition, photoresist application, masking, exposure, development, etching, photoresist stripping, and the like, but may also comprise other process procedures, for example, a postbaking process after development and before etching. Particular process procedure depends on the pattern required in practical manufacture, and is not limited here.

Here, the deposition process may be a chemical vapor deposition process, a plasma enhanced chemical vapor deposition process, or a physical vapor deposition process, which is not limited here. The mask used in the masking process may be a half tone mask, a single slit mask or a gray tone mask, which is not limited here. The etching may be dry etching or wet etching, which is not limited here.

Figure 2:
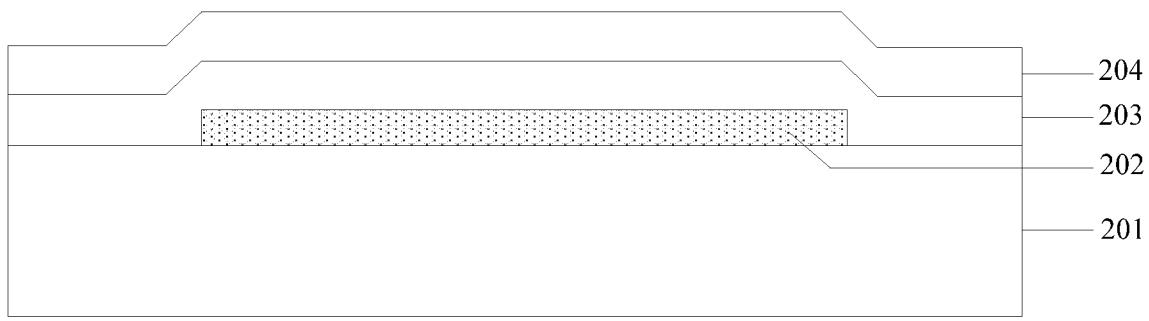
FIG. 2 is a schematic diagram showing a partial structure of a thin film transistor provided in an embodiment of the present disclosure.

The embodiments of the present disclosure further provide a thin film transistor, as shown in FIG. 2, comprising a base substrate 201, and an active layer 202 composed of polysilicon and a first gate insulating layer 203 having a high intrinsic tensile stress sequentially disposed on the base substrate 201. Optionally, in order to alleviate the influence of the first gate insulating layer 203 having a high intrinsic tensile stress on subsequent film layers, the thin film transistor may further comprise a second gate insulating layer 204 having a preset intrinsic pressure stress on a side of the first gate insulating layer 203 away from the active layer 202. The thin film transistor as shown in FIG. 2 may be made by using the above-mentioned manufacture method.

Notably, the above-mentioned thin film transistor provided in the embodiments of the present disclosure may be a P-type thin film transistor or an N-type thin film transistor, which is not limited here. When the above-mentioned thin film transistor is a P-type thin film transistor, the first gate insulating layer 203 having the high intrinsic tensile stress can effectively increase the hole mobility of the thin film transistor; and when the above-mentioned thin film transistor is an N-type thin film transistor, the first gate insulating layer 203 having the high intrinsic tensile stress can effectively increase the electron mobility of the thin film transistor.

In addition, it should be understood that all other essential components in a thin film transistor, such as gate metal layer, interlayer dielectric layer, source/drain metal layer, and the like, are also included in the above-mentioned thin film transistor provided in the embodiments of the present disclosure, which are not reiterated here and should not be construed as limiting the present disclosure. Further, since the principle by which the thin film transistor solves problems is similar to that of the above-mentioned manufacture method, for the implementation of the thin film transistor provided in the embodiments of the present disclosure, reference can be made to the implementation of the above-mentioned manufacture method, and the repeating part will not be reiterated here.

In order to better illustrate the technical solutions of the present disclosure, the above-mentioned manufacture method of a thin film transistor and corresponding thin film transistor provided in the embodiments of the present disclosure will be described in detail in the following two particular embodiments.

One embodiment according to the present disclosure comprises:

providing a glass base substrate;

forming a light shielding layer, a buffer layer and an active layer composed of polysilicon sequentially on the base substrate;

depositing a first gate insulating layer having an intrinsic tensile stress of 500 MPa to 800 MPa and a thickness of 600 Å to 1200 Å and a material of which is silicon dioxide ($SiO_2$) on the active layer by a plasma enhanced chemical vapor deposition process, under conditions of a temperature of 390° C. to 450° C., a power of 1200 W to 1800 W, and a flow rate ratio of silane to nitrous oxide ($SiH_4/N_2O$) of 0.5 to 2;

depositing a second gate insulating layer having an intrinsic pressure stress of −100 MPa to −400 MPa and a thickness of 300 Å to 600 Å and a material of which is silicon nitride ($SiN_x$) on the $SiO_2$ layer by a plasma enhanced chemical vapor deposition process, under conditions of a temperature of 250° C. to 350° C., a power of 1200 W to 1800 W, and a flow rate ratio of silane to ammonia gas ($SiH_4/NH_3$) of 0.1 to 3; and forming a gate metal layer, an interlay dielectric layer and a source/drain metal layer sequentially on the $SiN_x$ layer.

Thus, a thin film transistor having a relatively high carrier mobility is obtained.

Another embodiment according to the present disclosure comprises:

providing a glass base substrate;

forming a light shielding layer, a buffer layer and an active layer composed of polysilicon sequentially on the base substrate;

depositing a first gate insulating layer having an intrinsic tensile stress of 500 MPa to 800 MPa and a thickness of 600 Å to 1200 Å and a material of which is hafnium dioxide ($HfO_2$) on the active layer by a physical vapor deposition process at a temperature of 200° C. to 400° C. and a vacuum degree of $5 \times 10^{-4}$ Pa to $5 \times 10^{-3}$ Pa;

depositing a second gate insulating layer having an intrinsic pressure stress of −100 MPa to −400 MPa and a thickness of 300 Å to 600 Å and a material of which is silicon nitride ($SiN_x$) on the $HfO_2$ layer by a plasma enhanced chemical vapor deposition process, under conditions of a temperature of 250° C. to 350° C., a power of 1200 W to 1800 W, and a flow rate ratio of silane to ammonia gas ($SiH_4/NH_3$) of 0.1 to 3; and forming a gate metal layer, an interlay dielectric layer and a source/drain metal layer sequentially on the $SiN_x$ layer.

Thus, a thin film transistor having a relatively high carrier mobility is obtained.

In the above-mentioned manufacture method for a thin film transistor and the thin film transistor provided in the present disclosure, the manufacture method comprises: providing a base substrate; forming an active layer composed of polysilicon on the base substrate; and forming a first gate insulating layer having a preset intrinsic tensile stress on the active layer. In the technical solutions of the present disclosure, since the lattice size of the polysilicon in the active layer may change under the action of the preset intrinsic tensile stress of the first gate insulating layer, the carrier mobility of the thin film transistor can be effectively increased. As thus, the technical solutions of the present disclosure further increase the carrier mobility of the thin film transistor by setting the intrinsic tensile stress of the first gate insulating layer, without adding additional process or structure.

It should be noted that relational terms such as "first" and "second" herein are only intended to distinguish one entity or operation from another entity or operation, but it is not required or implied that these entities or operations have any practical relation or sequence of this kind.

Obviously, modifications and variations on the present application can be made by those skilled in the art without departing from the spirit and scope of the present application. As such, if these modifications and variations fall within the scope of the claims of the present application or equivalent technologies thereof, the present application is intended to encompass these modifications and variations.

What is claimed is:

1. A thin film transistor comprising:
a base substrate;
an active layer composed of polysilicon on the base substrate;
a buffer layer between the base substrate and the active layer;
a first gate insulating layer having a first preset intrinsic tensile stress on a side of the active layer away from the base substrate and in contact directly with the active layer, wherein the first preset intrinsic tensile stress is in a range of 500 MPa to 800 MPa;
a second gate insulating layer having a second preset intrinsic pressure stress on a side of the first gate insulating layer away from the base substrate; and
a gate metal layer, an interlayer dielectric layer and a source/drain metal layer sequentially formed on a side of the second gate insulating layer away from the base substrate, wherein via holes penetrating to the active layer are provided in the interlayer dielectric layer, the second gate insulating layer and the first gate insulating layer, so as to achieve a connection between the active layer and source/drain electrodes in the source/drain metal layer through the via holes;
wherein the first gate insulating layer has a thickness of 600 Å to 1200 Å;
wherein the second preset intrinsic pressure stress is in a range of −100 MPa to −400 MPa; and
wherein the second gate insulating layer has a thickness of 300 Å to 600 Å.

2. The thin film transistor according to claim 1, wherein a material of the first gate insulating layer is hafnium dioxide, silicon dioxide, silicon nitride, or a combination thereof.

3. The thin film transistor according to claim 1, wherein a material of the second gate insulating layer is hafnium dioxide, silicon dioxide, silicon nitride, or a combination thereof.

4. The thin film transistor according to claim 1, being a P-type thin film transistor.

5. The thin film transistor according to claim 1, being an N-type thin film transistor.

6. A manufacture method for the thin film transistor according to claim 1, comprising:
providing the base substrate;
forming the active layer composed of polysilicon on the base substrate;
forming the first gate insulating layer having the first preset intrinsic tensile stress on a side of the active layer away from the base substrate and in contact directly with the active layer, wherein the first preset intrinsic tensile stress is in the range of 500 MPa to 800 MPa, and the thickness of the first gate insulating layer is 600 Å to 1200 Å;
forming the second gate insulating layer having the second preset intrinsic pressure stress of −100 MPa to −400 MPa on a side of the first gate insulating layer away from the base substrate, wherein the thickness of the second gate insulating layer is 300 Å to 600 Å; and
forming the gate metal layer, the interlayer dielectric layer and the source/drain metal layer sequentially on a side of the second gate insulating layer away from the base substrate, wherein the via holes penetrating to the active layer are provided in the interlayer dielectric layer, the second gate insulating layer and the first gate insulating layer, so as to achieve a connection between the active layer and source/drain electrodes in the source/drain metal layer through the via holes;
wherein before forming the active layer composed of polysilicon on the base substrate, the manufacture method further comprises depositing the buffer layer on the base substrate.

7. The manufacture method according to claim 6, wherein forming the first gate insulating layer having the first preset intrinsic tensile stress on the active layer comprises:
forming the first gate insulating layer by a plasma enhanced chemical vapor deposition process under conditions of a temperature of 390° C. to 450° C., a power of 1200 W to 1800 W, and a flow rate ratio of silane to nitrous oxide of 0.5 to 2.

8. The manufacture method according to claim 6, wherein forming the first gate insulating layer having the first preset intrinsic tensile stress on the active layer comprises:
forming the first gate insulating layer on the active layer by a physical vapor deposition process under conditions of a temperature of 200° C. to 400° C. and a vacuum degree of $5\times10^{-4}$ Pa to $5\times10^{-3}$ Pa.

9. The manufacture method according to claim 6, wherein forming the second gate insulating layer having the second preset intrinsic pressure stress on a side of the first gate insulating layer away from the base substrate comprises:
forming the second gate insulating layer having the second intrinsic pressure stress of −100 MPa to −400 MPa on the first gate insulating layer by a plasma enhanced chemical vapor deposition process under conditions of a temperature of 250° C. to 350° C., a power of 1200 W to 1800 W, and a flow rate ratio of silane to ammonia gas of 0.1 to 3.

10. The manufacture method according to claim 6, wherein forming the active layer composed of polysilicon on the base substrate comprises:
forming a polysilicon thin film on the base substrate by a solid phase crystallization process, a metal-induced lateral crystallization process or an excimer laser annealing process, and then patterning the polysilicon thin film to obtain a pattern of the active layer.

* * * * *